United States Patent [19]
Mullarky

[11] Patent Number: 5,917,763
[45] Date of Patent: Jun. 29, 1999

[54] METHOD AND APPARATUS FOR REPAIRING OPENS ON GLOBAL COLUMN LINES

[75] Inventor: Patrick J. Mullarky, Meridian, Id.

[73] Assignee: Micron Technology, Inc., Boise, Id.

[21] Appl. No.: 08/928,706

[22] Filed: Sep. 12, 1997

[51] Int. Cl.[6] .................................................. G11C 7/00
[52] U.S. Cl. ...................... 365/200; 365/201; 365/203; 365/225.7; 365/185.13
[58] Field of Search ................................. 365/200, 201, 365/203, 225.7, 185.13

[56] References Cited

U.S. PATENT DOCUMENTS

| | | | |
|---|---|---|---|
| 5,088,066 | 2/1992 | Castro ................................ | 365/230.06 |
| 5,200,652 | 4/1993 | Lee ...................................... | 307/465 |
| 5,270,975 | 12/1993 | McAdams .............................. | 365/200 |
| 5,278,793 | 1/1994 | Yeh ...................................... | 365/200 |
| 5,323,348 | 6/1994 | Mori et al. ............................. | 365/200 |
| 5,349,558 | 9/1994 | Cleveland et al. ..................... | 365/200 |
| 5,479,371 | 12/1995 | Ootani .................................. | 365/200 |
| 5,487,041 | 1/1996 | Wada .................................... | 365/200 |
| 5,495,445 | 2/1996 | Proebsting ............................ | 365/200 |
| 5,499,215 | 3/1996 | Hatta ................................... | 365/230.03 |
| 5,502,674 | 3/1996 | Griffus et al. ......................... | 365/200 |
| 5,524,115 | 6/1996 | Kim ..................................... | 371/10.3 |
| 5,528,539 | 6/1996 | Ong et al. ............................. | 365/200 |
| 5,568,432 | 10/1996 | Wada .................................... | 365/200 |
| 5,612,918 | 3/1997 | McClure ............................... | 365/200 |
| 5,621,691 | 4/1997 | Park ...................................... | 365/200 |
| 5,673,231 | 9/1997 | Furutani ............................... | 365/200 |
| 5,689,464 | 11/1997 | Lee et al. .............................. | 365/200 |

*Primary Examiner*—David Nelms
*Assistant Examiner*—Tuan T. Nguyen
*Attorney, Agent, or Firm*—Arnold, White & Durkee

[57] ABSTRACT

A memory array arranged in rows and columns includes a global column line. The global column line has proximal and distal ends and is adapted to enable a predetermined number of columns in the array. A repair circuit connected to the distal end of the global column line is adapted to detect a fault on the global column line and disable the global column line if the fault is detected. A repair circuit for a signal line includes a programming circuit and a sensing circuit. The programming circuit includes a programmable element and is adapted to detect a fault on the signal line and program the programmable element if the fault is detected. The sensing circuit is adapted to detect a programmed condition of the programmable element and ground an end of the signal line in response to the programmed condition. A method for repairing a memory array having a global column line includes detecting a fault on the global column line of the array and disabling the global column line if the fault is detected.

48 Claims, 6 Drawing Sheets

METHOD AND APPARATUS FOR REPAIRING OPENS ON GLOBAL COLUMN LINES

BACKGROUND OF THE INVENTION

1. Field of the Invention

The present invention relates generally to semiconductor memory devices, and more particularly to repairing faulty global column lines in a dynamic random access memory (DRAM).

2. Description of Related Art

In the fabrication of semiconductor memory devices it is common for an array of memory cells to include one or more defects that prevent proper performance of the memory array. A block diagram of a semiconductor memory array die 100 is shown in FIG. 1, and a simplified schematic of select connections within the die 100 is shown in FIG. 2. The array chosen for illustration is a 16 megabyte dynamic random access memory (DRAM). The memory array is divided into 64 subarrays 105, and each subarray 105 has 512 interleaved columns 110 (shown in FIG. 2) and 512 rows (not visible). The columns 110 run horizontally and extend through each of the eight subarrays 105. The rows each comprise 4 sections running ¼ of the width of the die 100. Each section has its own driver (not shown), and all 4 row drivers are enabled when the row is selected. Between each subarray 105 and adjacent each subarray 105 bordering an edge of the die 100, there is a sense amplifier gap. The memory array has four input/output (I/O) lines 117 per sense amplifier gap (2 of which are shown in FIG. 2) for reading from and writing to the memory array. To access the memory array, the I/O lines 117 are tied to the columns 110. The columns 110 to be addressed are enabled by a global column line 120 running parallel to the columns 110. The number of columns 110 accessed by each global column line 120 typically equals the number of I/O lines 117 for the subarray 105. In the DRAM of FIG. 1, four cells within a selected subarray 105 may be accessed simultaneously.

The global column lines 120 are driven from the center of the semiconductor die 100 by center logic 125. The global column lines 120 run from the center of the die 100 outward to the edge of the die 100. There are 1024 columns 110 in each quadrant of the die 100, and therefore there are 256 global column lines 120 in each quadrant. In each sense amplifier gap, connections are made between the global column line 120 and gates that connect the columns 110 to the I/O lines 117. A simplified circuit diagram of the connections made in the gap is shown in FIG. 2.

For ease of illustration, FIG. 2 depicts a circuit 200 having two I/O lines 117, instead of the four I/O lines described in reference to FIG. 1. Accordingly, each global column line 120 addresses two columns 110. A circuit having 4 I/O lines 117 is more complex and may have additional space saving features such as column interleaving and sense amp sharing. In FIG. 2, a column 110 is represented by cooperating digit and digit* 210, 220 lines (where an asterisk, "*", is used to indicate a compliment signal). A row is represented by the word line 230. A memory cell 240, consisting of a capacitor 242 and a transistor 244, is connected to the digit* line 220. Typically, memory cells 240 in adjacent rows are alternately connected to either the digit or digit* line 210, 220.

Initially, the digit and digit* lines 210, 220 are equilibrated to a common voltage such as half of a supply voltage, Vcc. When the memory cell 240 is read, the wordline 230 energizes the gate of the transistor 244. If the capacitor 242 is uncharged (i.e. 0 volts corresponding to a logic 0), it will pull down the voltage on the digit* line 220. If the capacitor 242 is charged (i.e. Vcc=3.3 volts corresponding to a logic 1), it will pull up the voltage on the digit* line 220. A sense amplifier 250 senses a voltage difference between the digit and digit* lines 210, 220. The sense amp 250 ties the digit or digit* line 210, 220 attached to the memory cell 240 high or low depending on the logic level read from the memory cell and ties the complimentary digit or digit* line 210, 220 to the opposite logic level. The digit and digit* lines are equilibrated to half of the supply voltage, Vcc at some time after the memory read has been completed.

The digit and digit* lines 210, 220 are connected to the I/O lines 117 through pass gates 260. The global column line 120 is attached to a control input of the pass gates 260. When the global column line 120 is energized, the n-channel transistors, which make up the pass gates 260, are enabled, thus tying the digit and digit* lines 210, 220 to the I/O lines 117.

DRAMs are typically provided with redundancy repair circuits to substitute redundant columns for faulted columns to increase the yield. In the process of repairing a faulted column, the address of the faulted column is remapped to a redundant column. In a memory array having global column lines 120, a single defective column 110 results in all four grouped columns 110 being remapped. The center logic 125 typically includes an inverter that drives the global column line 120 high (Vcc) if a column 110 in the set is selected, and drives the global column line 120 low (GND) if no columns 110 in the set are selected. Grounding the global column line 120 prevents the pass gates 160 from being enabled, thus isolating the associated columns 110 from the I/O lines 117. Because the replaced columns 110 were remapped, they cannot be selected. Accordingly, the center logic 125 always drives the global column line low.

Typically, global column lines 120 are formed on the semiconductor die 100 above the columns 110 with at least one dielectric layer disposed therebetween. For each connection made in the gap, a contact opening must be made in the dielectric layer separating the global column line 120 from the pass gates 260. There is a potential for faults to be formed in the global column line 120 during manufacture. Global column line faults are most likely to occur in the gap regions where the connections to the underlying circuit elements are made.

The lead end of the global column line 120 is grounded due to the low signal provided by the center logic 125, thus preventing the pass gates 260 from being activated. However, if the fault results in an open circuit in the global column line 120, such as a fault caused by an open via, the portion of the global column line 120 between the center logic 125 and the fault is grounded, but the portion between the fault and the distal end of the global column line is floating. Signals present on circuit elements below the floating portion can, through capacitive coupling, transfer a voltage to the floating portion of the faulted global column line 120. If the transferred voltage exceeds the turn-on voltage of the pass gates 260, the pass gates 260 will connect column lines 110 from the disabled columns to the I/O lines 117, resulting in erroneous data being placed on the I/O lines 117. This condition, known as a block fail, results in the semiconductor die 100 being discarded.

It would be desirable to repair a faulted global column line in a manner that prevents block fails due to capacitive coupling between the floating portion of the global column line 120 and the underlying circuit elements.

SUMMARY OF THE INVENTION

An aspect of the invention is seen in a memory array arranged in rows and columns. The memory array includes a global column line. The global column line has proximal and distal ends and is adapted to enable a predetermined number of columns in the array. A repair circuit connected to the distal end of the global column line is adapted to detect a fault on the global column line and disable the global column line if the fault is detected.

Another aspect of the invention is seen in a method for repairing a memory array having a global column line. The method comprises detecting a fault on the global column line of the array and disabling the global column line if the fault is detected.

Figure 1:
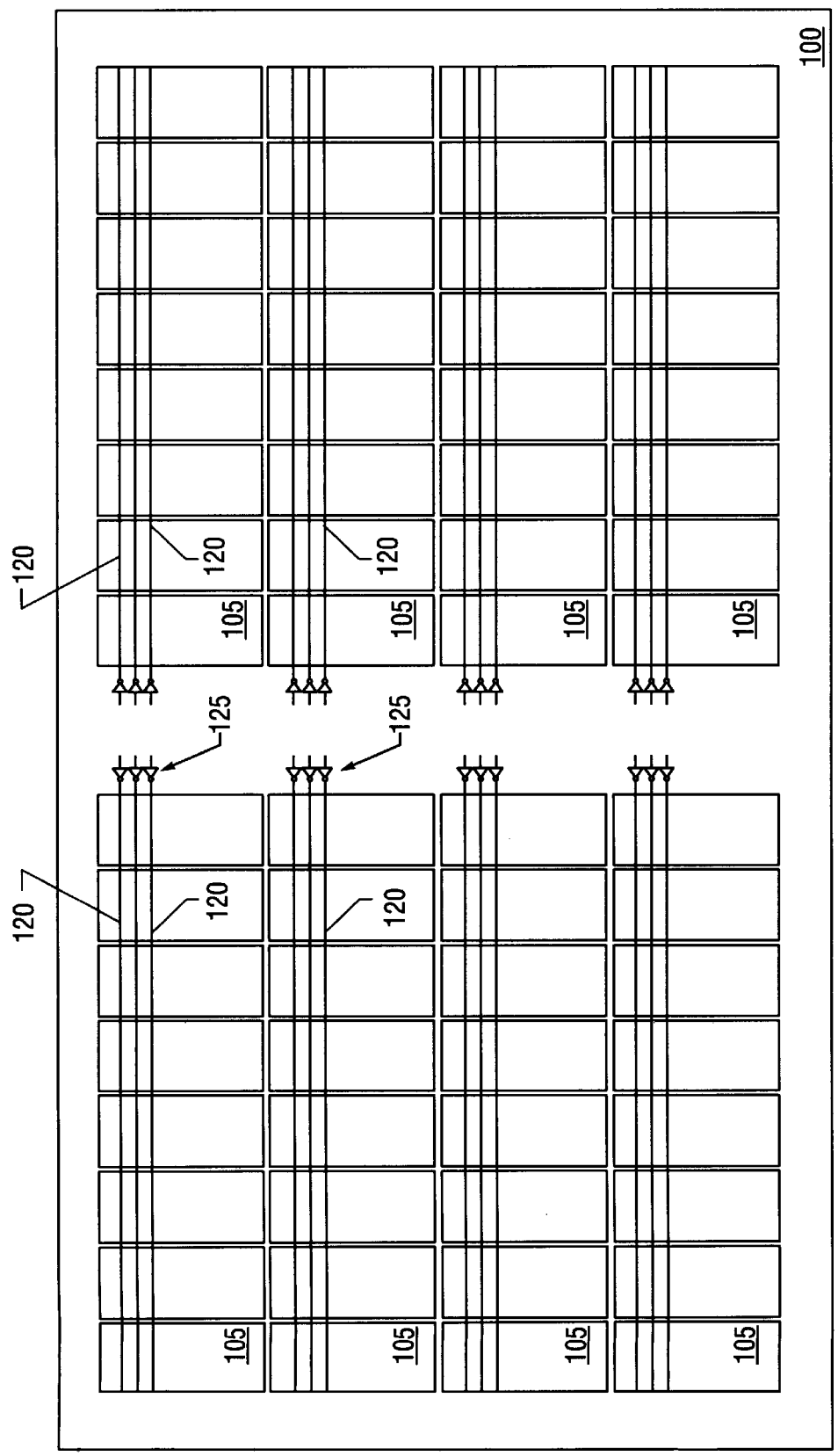
FIG. 1 illustrates a top-level block diagram of a dynamic random access memory array (DRAM)
Figure 2:
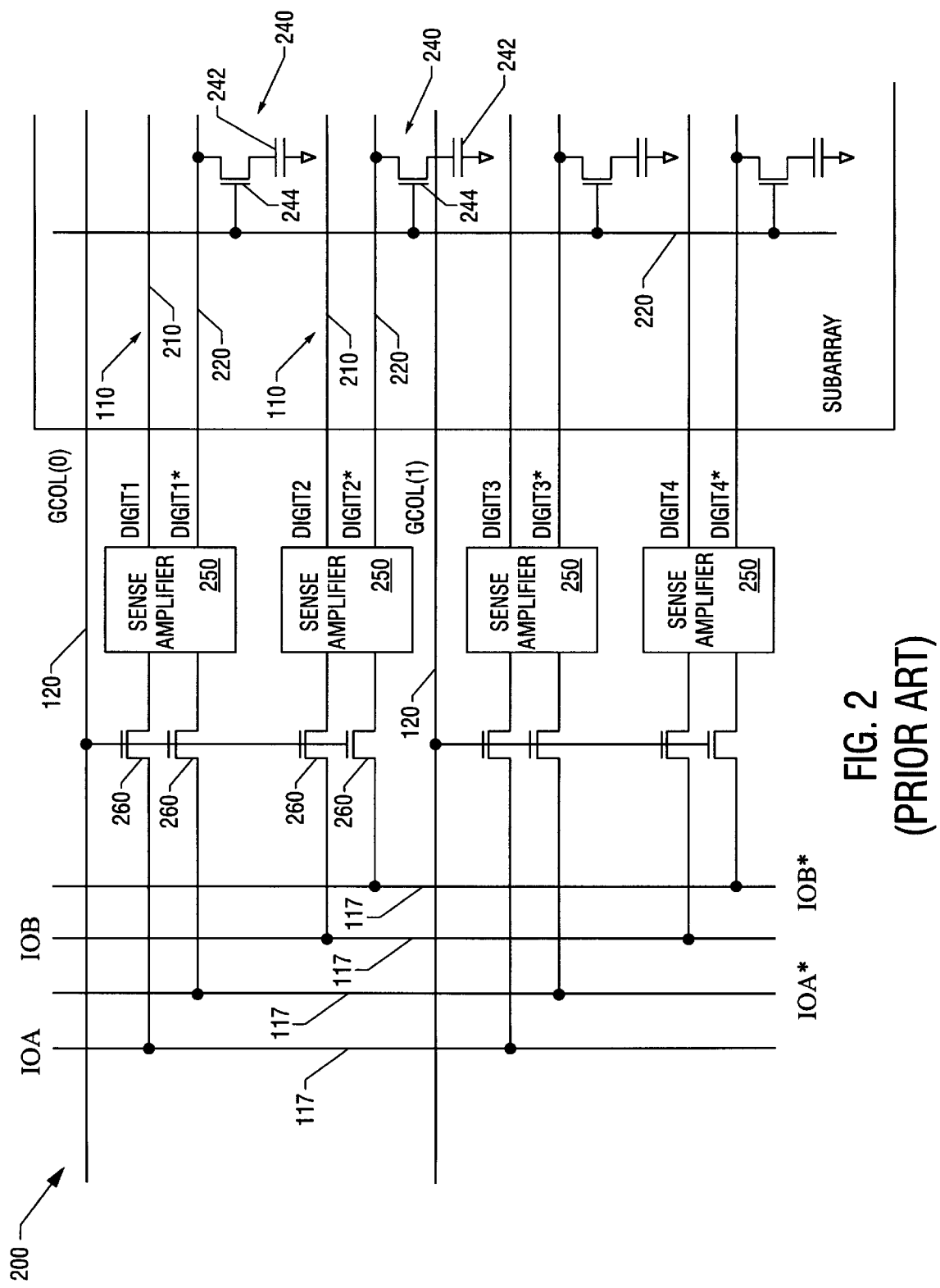
FIG. 2 illustrates a simplified circuit diagram showing connections between the global column lines and pass gates for enabling columns and I/O lines located in the gaps between subarrays of the DRAM of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DESCRIPTION OF ILLUSTRATIVE EMBODIMENTS

The following examples are included to demonstrate preferred embodiments of the invention. It should be appreciated by those skilled in the art that the techniques disclosed in the examples that follow represent techniques discovered by the inventor to function well in the practice of the invention. However, those skilled in the art should, in light of the present disclosure, appreciate that many changes can be made in the specific embodiments disclosed herein without departing from the spirit and scope of the invention.

Figure 3:
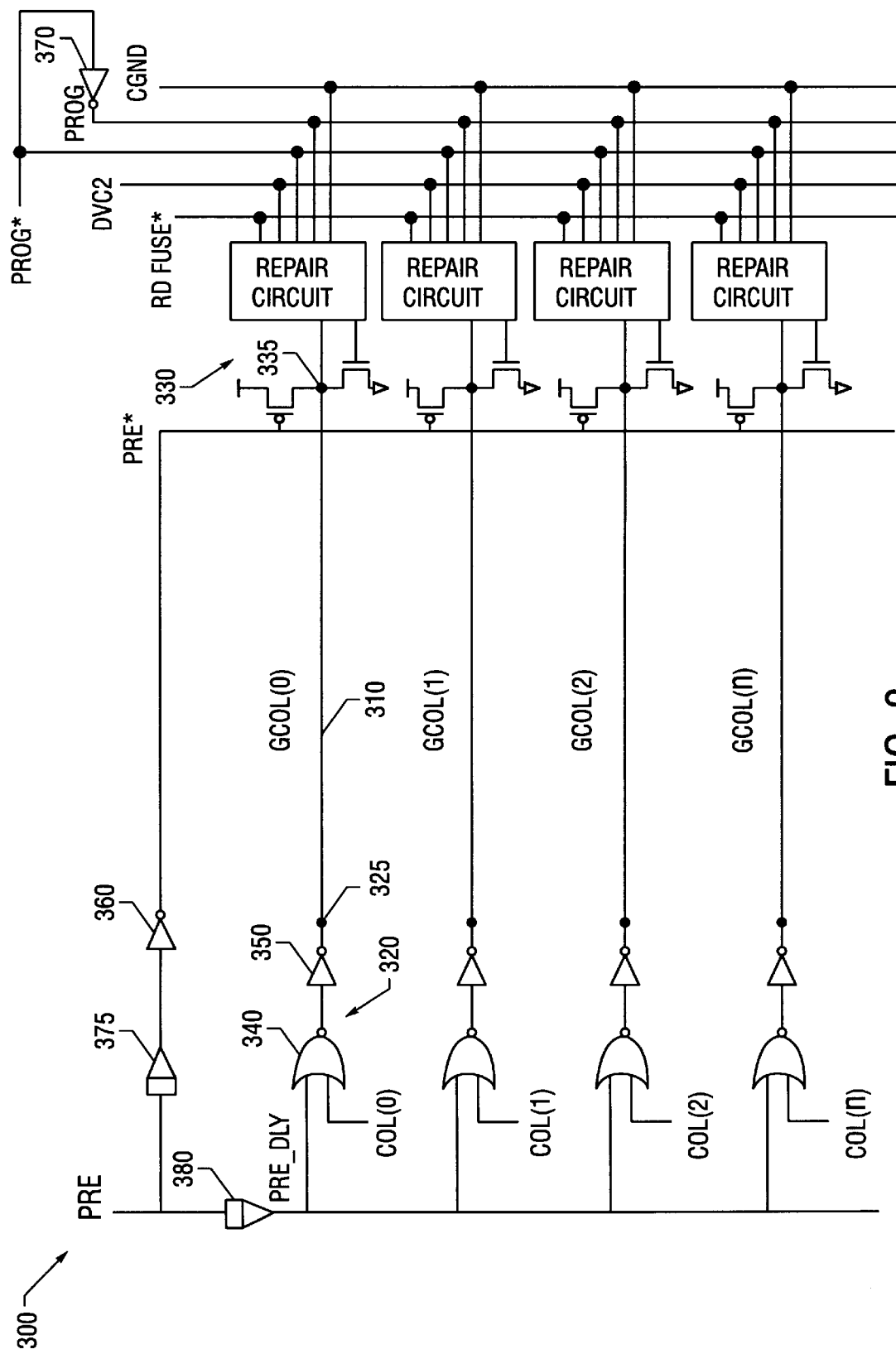
FIG. 3 illustrates a global column driving circuit for the DRAM of FIG. 1.
Figure 4:
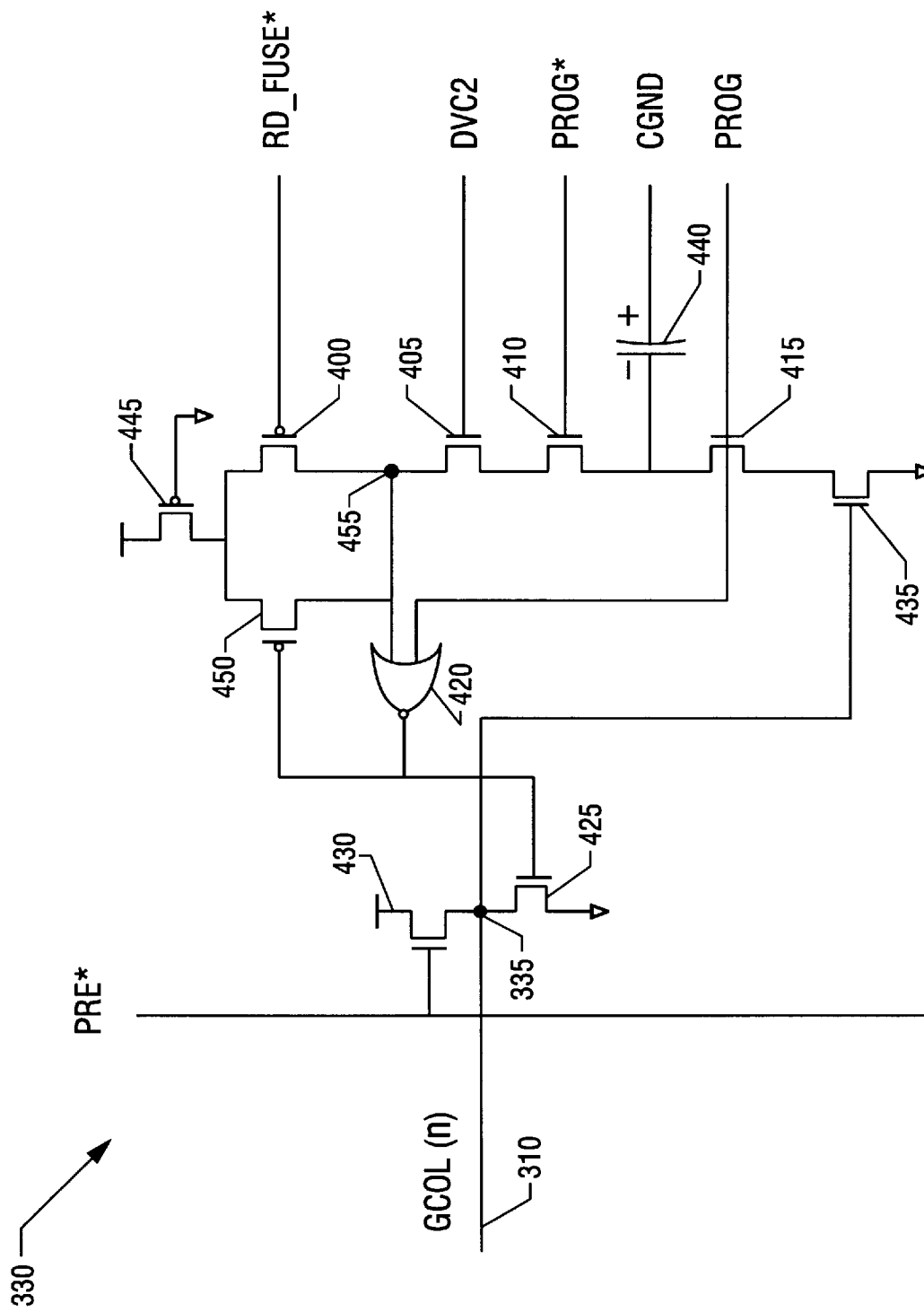
FIG. 4 illustrates a repair circuit for the global column driving circuit of FIG. 3.

Referring to FIG. 3, a global column driving circuit 300 of the invention is shown. Associated with each global column line (GCOL) 310 is a driver circuit 320 connected to the proximal end 325 of the GCOL 310 and a repair circuit 330 connected to the distal end 335 of the GCOL 310. The driver circuit 320 includes a NOR gate 340 and an inverter 350. The repair circuit 330, shown in FIG. 4, is used to detect and disable a faulted GCOL 310. For purposes of this illustration, the third GCOL 310 has a fault 355 in the form of an open via, resulting in an open circuit. Accordingly, the portion of the GCOL 310 between the fault 355 and the repair circuit 330 is floating.

To detect and repair a faulted GCOL 310, the repair circuit 330 of FIG. 4 uses a precharge signal (PRE and PRE*) for testing the continuity of the GCOL 310, a read fuse signal (RD$_{13}$FUSE*) for determining if the GCOL 310 has been previously disabled, a divided Vcc signal (DVC2) equal to half of Vcc (i.e. 1.65V), a program signal (PROG* and PROG) for disabling the GCOL 310, and a common ground (CGND) reference. PRE* and PROG are provided by inverters 360 and 370, respectively. A delay element 375 delays PRE*.

Figure 5:
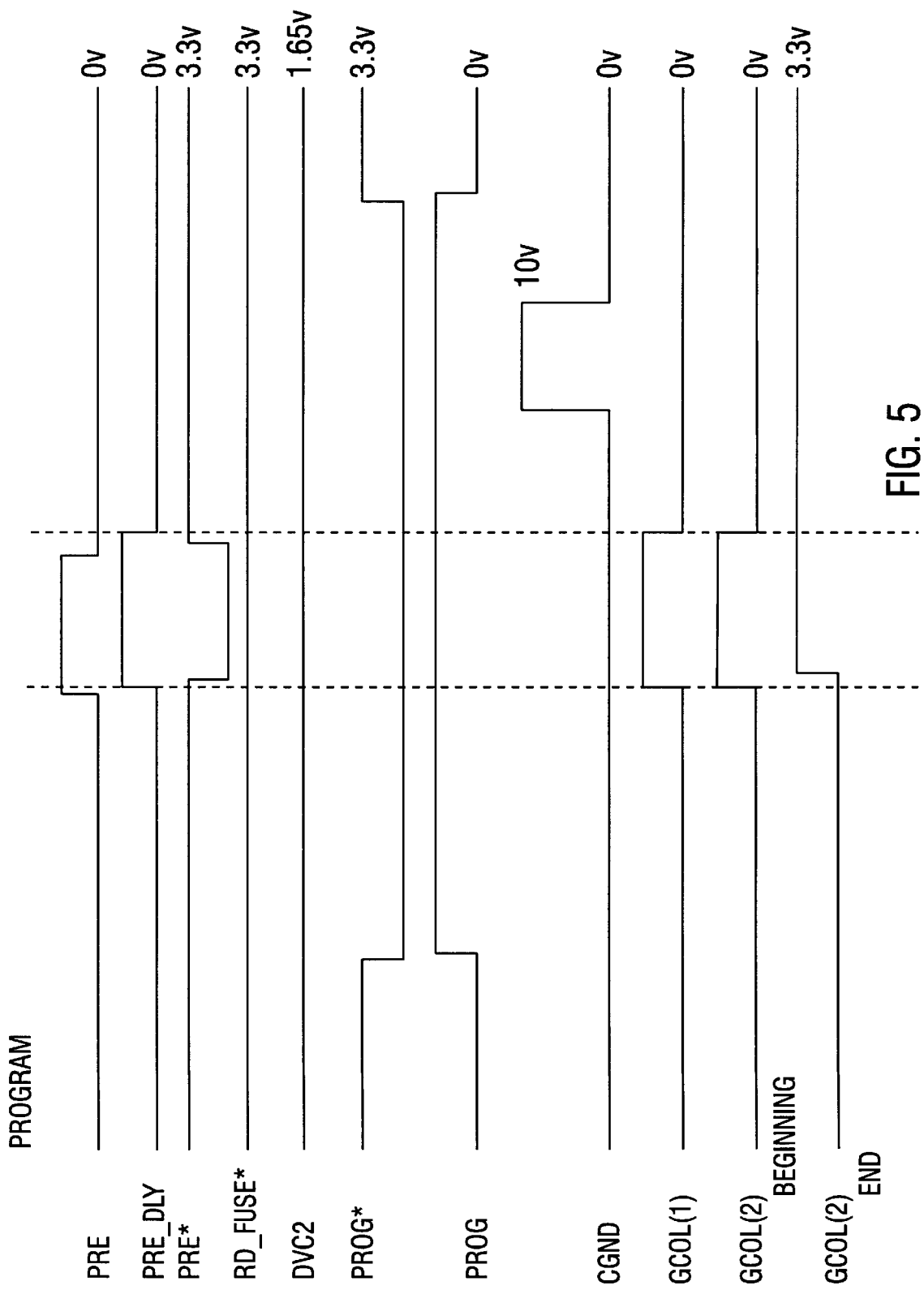
FIG. 5 illustrates a timing diagram of the control signals provided to the circuits of FIGS. 3 and 4 to detect and repair a faulted global column line.

The timing relationships between the control signals responsible for detecting and disabling the faulted GCOL 310 are shown in FIG. 5. The process of detecting and disabling is hereinafter referred to as programming and is described in conjunction with the schematic diagram of the repair circuit 330 shown in FIG. 4. During the programming process RD$_{13}$FUSE* is held high, which disables the gate of a p-channel transistor 400, and DVC2 remains at 1.65V (half of Vcc), which enables the gate of an n-channel transistor 405.

PROG* transitions low, and, after a small gate delay due to the inverter 370, PROG transitions high, thus disabling the gate of an n-channel transistor 410 and enabling the gate of an n-channel transistor 415, respectively. A NOR gate 420 receives the high PROG signal and outputs a low input to the gate of an n-channel transistor 425, thus isolating GCOL 310 from ground.

Following the PROG and PROG* transitions, PRE pulses high, resulting in PRE* pulsing low after a small delay from the delay element 375. PRE* low enables the gate of a p-channel transistor 430 and forces GCOL 310 high at the distal end 335. PRE is also provided as an input to a negative edge delay element 380, which in turn provides a negative edge delayed precharge signal (PRE_DLY). PRE_DLY provides a high input to the NOR gate 340, which outputs a low signal which is inverted by inverter 350 to drive the GCOL 310 high from the proximal end 325. As a result, both ends 325, 335 of the GCOL 310 are driven high.

Delay element 375 and negative edge delay element 380 cooperate to minimize the potential for crossing currents associated with both PRE* and PRE_DLY being low at the same time. If PRE* and PRE_DLY were both low, the driver circuit 320 would attempt to pull the GCOL 310 low and the p-channel transistor 430 would simultaneously attempt to pull the GCOL 310 high, thus providing a direct path from Vcc to ground and draining current. The negative edge of the PRE signal is delayed by the negative edge delay element 380 to enable PRE* sufficient time to go high after PRE is removed to minimize crossing current.

After PRE, and correspondingly PRE_DLY returns low, the high signal input to the driver circuit 320 is removed and the inverter 350 will attempt to pull the GCOL 310 low from the proximal end 325. If there is a fault 355 in the GCOL 310, only the portion of the GCOL 310 before the fault 355 will be pulled low by the driver circuit 320. The floating portion of the GCOL 310 after the break will remain high. The signal GCOL(1) in FIG. 5 shows the response of a good global column line. The signals GCOL(2)$_{beginning}$ and GCOL(2)$_{end}$ show the response of a faulted global column line as seen from the proximal and distal ends 325, 335, respectively. As seen by the signal GCOL(2)$_{end}$, the floating portion of the faulted GCOL 310 will remain at Vcc, thus enabling the gate of an n-channel transistor 435.

With the gate of the n-channel transistor 435 enabled, the negative plate of an antifuse capacitor 440 is grounded. A high voltage (e.g. 10V) pulse is injected on the CGND line. The high voltage applied to the antifuse capacitor 440 ruptures the dielectric separating the positive and negative plates, thus creating a resistive conduction path between the plates. Although the invention is described using an antifuse capacitor 440 as a programmable element, it is contemplated that other programmable elements may be used.

If the GCOL 310 had been intact and the distal end 335 had been pulled low by the drive circuit 320, the gate of n-channel transistor 435 would have been disabled, thus preventing a path to ground from the negative plate of the antifuse capacitor 440. Without the path to ground on the negative plate, the negative plate would be connected to a floating node which follows any voltage changes seen on the positive plate. The high voltage pulse on the CGND line would be transferred to the capacitively coupled floating node, resulting in no voltage across the dielectric of the antifuse capacitor 440. Accordingly, the antifuse capacitor 440 would remain intact.

Figure 6:
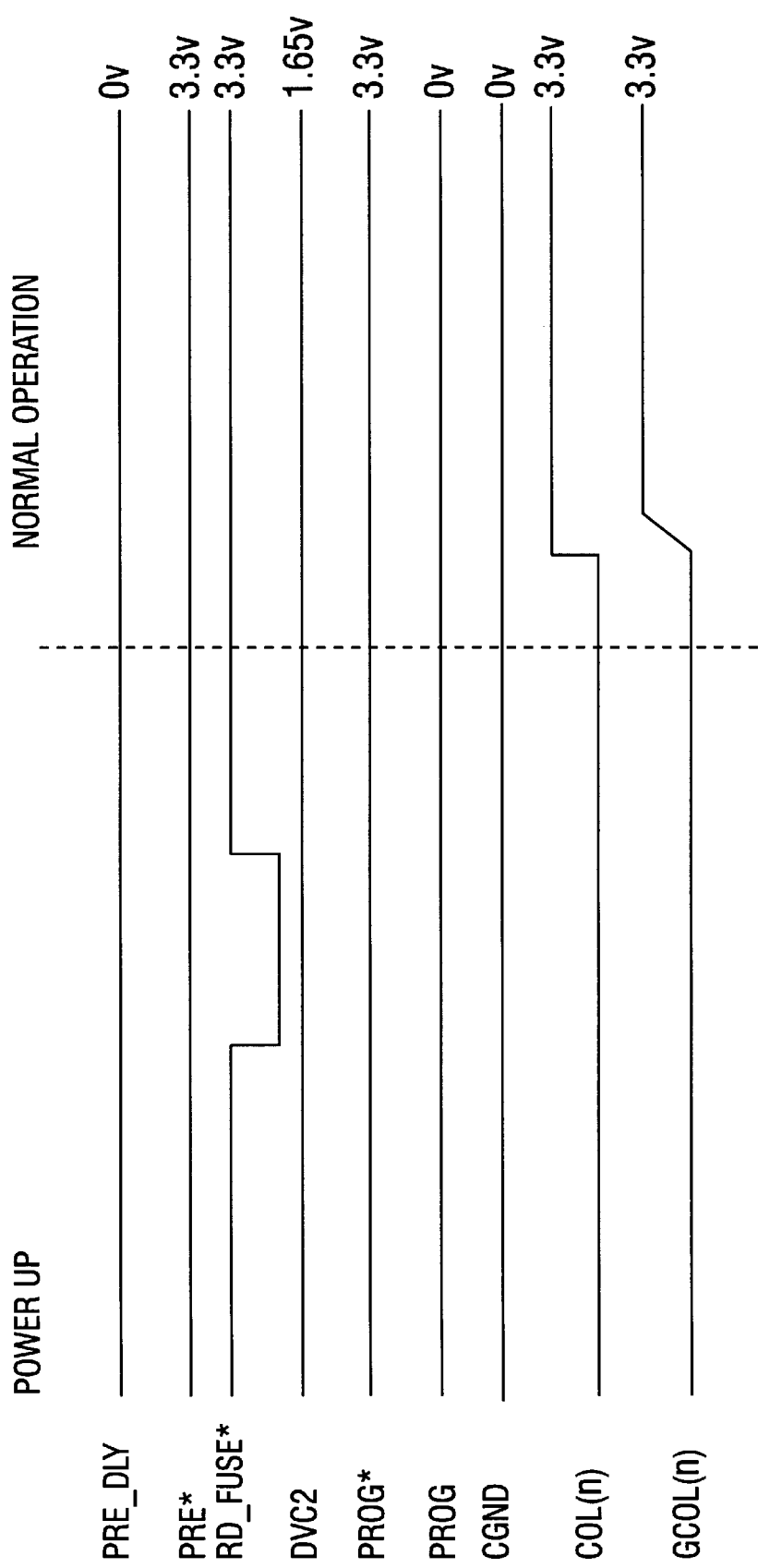
FIG. 6 illustrates a timing diagram of the control signals provided to the circuit of FIGS. 3 and 4 to detect a repaired global column line during power-up.

After the faulted GCOL lines 310 have been detected and disabled, the condition of the antifuse capacitor 440 is read during the power-up cycle of the die 100, as is illustrated by the timing diagrams of FIG. 6. On power-up, $RD_{13}$ FUSE* pulses low, thus enabling the gate of the p-channel transistor 400. The gate of the p-channel transistor 445 is grounded, thus allowing Vcc to pass through the p-channel transistor 400, charge node 455 and enable the NOR gate 420. The NOR gate 420 provides a low signal to the gate of p-channel transistor 450, which in turn provides Vcc from the p-channel transistor 445 to maintain the input of the NOR gate 420 high. The resulting latched output of the NOR gate 420 disables the gate of the n-channel transistor 425.

If the antifuse capacitor 440 is intact, the node 455 will remain charged. The p-channel transistor 450 is sized such that it is capable of compensating for a small amount of leakage current on node 455, but not sufficiently large to charge the node 455 if there is a resistive path to ground through a blown antifuse capacitor 440. The p-channel transistor 400 is sized such that it can charge the node 455 during the RD_FUSE* pulse.

If the antifuse capacitor 440 has been programmed, a resistive path to CGND will be present through the antifuse capacitor 440. The p-channel transistor 450 cannot conduct sufficient current to maintain the charge on the node 455, and therefore the node 455 will be pulled to ground, removing the high input at the NOR gate 420. The NOR gate 420 then provides a high output which disables the gate of the p-channel transistor 450 and enables the gate of the n-channel transistor 425, thus grounding the distal end 335 of the faulted GCOL 310.

The transistors 415, 430, 435 form a programming circuit for detecting the faulted GCOL 310 and programming the antifuse capacitor 440. The transistors 400, 405, 445, 450 and NOR gate 420 form a sensing circuit to identify if the antifuse capacitor 440 has been programmed. The transistor 425 is the output from the sensing circuit. The transistor 410 isolates the programming circuit from the sensing circuit and the transistor 425 while the antifuse capacitor 440 is being programmed.

The grounded faulted GCOL 310 is not susceptible to capacitive coupling with the underlying circuit elements, thus preventing block fails. A semiconductor die 100 repaired as described above can then be used rather than discarded.

During normal operation, PROG, PRE, and PRE_DLY remain low. Because PRE_DLY remains low, the driver circuit 320 will be controlled by the global column select signal (COL) generated by the column decode logic (not shown) when one of the columns 110 associated with the GCOL 310 is addressed, as is shown in the normal operation portion of FIG. 6.

The n-channel transistor 405 in combination with its DVC2 input signal is useful for preventing unintentional programming of the antifuse capacitor 440. The maximum voltage across a n-channel transistor is limited to the voltage applied to its gate minus the turn on voltage of the n-channel transistor. Accordingly, n-channel transistor 405 limits the voltage at the negative plate of the antifuse capacitor 440 to DVC2 (1.65v) minus the turn-on voltage (approximately 0.7v), or 0.95v. Limiting the voltage on the negative plate of the antifuse capacitor 440 reduces the likelihood of unintentionally programming the antifuse capacitor 440 due to a voltage deviation.

While the invention is susceptible to various modifications and alternative forms, specific embodiments have been shown by way of example in the drawings and have been described in detail herein. However, it should be understood that the invention is not intended to be limited to the particular forms disclosed. It will be appreciated by those of ordinary skill having the benefit of this disclosure that numerous variations from the foregoing illustrations will be possible without departing from the inventive concept described herein. Accordingly, it is the claims set forth below, and not merely the foregoing illustration, which are intended to define the exclusive rights claimed in this application.

I claim:

1. A memory array arranged in rows and columns, the memory array comprising:

a global column line having proximal and distal ends and adapted to enable a plurality of columns in the memory array; and a repair circuit connected to the distal end of the global column line adapted to detect a fault on the global column line and disable the global column line if the fault is detected.

2. The memory array of claim 1, further comprising:

a driver circuit connected to the proximal end of the global column line.

3. The memory array of claim 2, wherein the driver circuit is adapted to receive a precharge control signal and drive the global column line high from the proximal end in response to the precharge input signal and the repair circuit is adapted to receive the precharge control signal and drive the global column line high from the distal end in response to the precharge input signal, and wherein the distal end of the global column line remains high after the precharge control signal has been removed if the global column line is faulted.

4. The memory array of claim 3, further comprising:

a delay element connected between the precharge control signal and the driver circuit to provide a delayed precharge signal to the driver circuit.

5. The memory array of claim 3, the repair circuit including an antifuse capacitor, wherein the repair circuit is adapted to ground a negative plate of the antifuse capacitor if the distal end of the global column line remains high after the precharge control signal has been removed.

6. The memory array of claim 5, including a first transistor connected between the negative plate of the antifuse capacitor and a second transistor connected to ground, with the gate input of the second transistor being connected to the distal end of the global column line, and the gate input of the first transistor being connected to a program control signal.

7. The memory array of claim 5, wherein the antifuse capacitor is capable of being programmed by a voltage pulse applied to a positive plate of the antifuse capacitor if the negative plate is grounded.

8. The memory array of claim 3, wherein the repair circuit includes:
   a transistor connected between a voltage source and the distal end of the global column line and having a gate input connected to the precharge control signal.

9. The memory array of claim 7, wherein the repair circuit includes a sensing circuit adapted to detect if the antifuse capacitor has been programmed.

10. The memory array of claim 9, wherein the repair circuit includes a first transistor connected between the antifuse capacitor and the sensing circuit, the gate input of the first transistor being connected to a program control signal.

11. The memory array as in claim 9, the sensing circuit providing an output at a first voltage level if the antifuse capacitor is intact and an output at a second voltage level if the antifuse capacitor has been programmed, wherein the repair circuit includes:
   a transistor connected between the distal end of the global column line and ground and having a gate input connected to the sensing circuit.

12. The memory array of claim 10, wherein the sensing circuit includes:
   a second transistor connected to a voltage source; and
   a node connected to the first transistor and the second transistor,
   wherein the gate input of the second transistor is connected to a read fuse control signal adapted to charge the node in response to the read fuse control signal and the antifuse capacitor provides a path to ground if programmed to discharge the node when the read fuse control signal is removed.

13. The memory array of claim 12, wherein the repair circuit includes:
   a third transistor connected between the distal end of the global column line and ground and having a gate input connected to the node.

14. The memory array of claim 13, wherein the sensing circuit includes:
   a NOR gate connected between the node and the third transistor; and
   a fourth transistor connected between a voltage source and the node and having a gate input connected to the output of the NOR gate, the fourth transistor and NOR gate cooperating to form a latch adapted to compensate for leakage current from the node if the antifuse capacitor remains intact.

15. A memory array arranged in rows and columns, the memory array comprising:
   a global column line having proximal and distal ends and adapted to enable a plurality of columns in the memory array;
   means for detecting a fault on the global column line of the memory array; and
   means for disabling the global column line if the fault is detected.

16. The memory array of claim 15, wherein the means for disabling include means for grounding the distal end of the global column line if the fault is detected.

17. The memory array of claim 15, further including:
   means for sensing a disabled global column line; and
   means for grounding the distal end of the global column line after the disabled global column line is sensed.

18. A memory array arranged in rows and columns, the memory array comprising:
   a global column line having proximal and distal ends and adapted to enable a plurality of columns in the memory array;
   a driver circuit connected to the proximal end of the global column line; and
   a repair circuit connected to the distal end of the global column line, the repair circuit including:
      a programming circuit including a programmable element, the programming circuit being adapted to detect a fault on the global column line and program the programmable element to change a programmed condition of the programmable element if the fault is detected; and
      a sensing circuit adapted to detect the programmed condition of the programmable element and ground the distal end of the global column line in response to the programmed condition.

19. The memory array of claim 18, wherein the programmable element includes an antifuse capacitor having a positive plate and a negative plate.

20. The memory array of claim 19, wherein the programming circuit includes:
   a first transistor connected between a voltage source and the distal end of the global column line having a gate input connected to a precharge control signal adapted to charge the global column line from the distal end in response to the precharge control signal;
   a second transistor connected at its source to the negative plate of the antifuse capacitor and having a gate input connected to a programming control signal; and
   a third transistor connected between the drain of the second transistor and ground having a gate input connected to the distal end of the global column line.

21. The memory array of claim 18, wherein the sensing circuit includes:
   a first transistor connected between the distal end of the global column line and ground;
   a logic gate having an output connected to a gate input of the first transistor;
   a node connected to an input of the logic gate;
   a second transistor connected to a voltage source and the node and having a gate input connected to a read fuse control signal adapted to charge the node in response to the read fuse control signal, wherein the programmable element provides a path to ground if programmed to discharge the node when the read fuse control signal is removed; and
   a third transistor connected between the voltage source and the node and having a gate input connected to the output of the logic gate, the third transistor and the logic gate cooperating to form a latch adapted to compensate for leakage current from the node if the programmable element remains intact.

22. A memory array arranged in rows and columns, the memory array comprising:
   a global column line having proximal and distal ends and adapted to enable a predetermined number of columns in the array;
   a driver circuit connected to the proximal end of the global column line;
   a programmable element;
   a first transistor connected between a voltage source and the distal end of the global column line having a gate input connected to a first control signal;

a second transistor connected at its source to the programmable element and having a gate input connected to a programming control signal;

a third transistor connected between the drain of the second transistor and ground having a gate input connected to the distal end of the global column line;

a fourth transistor connected between the distal end of the global column line and ground;

a logic gate having an output connected to a gate input of the fourth transistor;

a node connected to an input of the logic gate;

a fifth transistor connected to a voltage source and the node and having a gate input connected to a second control signal; and a sixth transistor connected between the voltage source and the node and having a gate input connected to the output of the logic gate.

23. The memory array of claim 22, wherein the programmable element comprises an antifuse capacitor.

24. A method for repairing a memory array having a global column line adapted to enable a plurality of columns in the memory array, the method comprising:

detecting a fault on the global column line adapted to enable a plurality of columns in the memory array; and disabling the global column line if the fault is detected.

25. The method of claim 24, wherein the disabling includes:

grounding a distal end of the global column line.

26. The method of claim 24, wherein the detecting includes:

providing a precharge signal;

charging the global column line from a proximal end in response to the precharge signal;

charging the global column line from a distal end in response to the precharge signal;

removing the precharge signal; and sensing a charged condition of the distal end of the global column line after removing the precharge signal.

27. The method of claim 24, wherein the disabling includes:

programming a programmable element.

28. The method of claim 27, the programmable element comprising an antifuse capacitor, and wherein programming includes:

grounding a first plate of the antifuse capacitor in response to the charged condition; and providing a voltage pulse to a second plate of the antifuse capacitor to rupture a dielectric separating the first and second plates.

29. The method of claim 27, wherein the disabling further includes:

sensing a programmed condition of the programmable element; and grounding a distal end of the global column line in response to the programmed condition.

30. The method of claim 29, wherein the sensing comprises:

providing a read fuse control signal;

charging a node connected to the programmable element with a voltage in response to the read fuse control signal;

removing the read fuse control signal; and monitoring the charged node to identify if the voltage is dissipated through the programmable element.

31. A method for repairing a memory array having a global column line, the global column line having proximal and distal ends, the method comprising:

providing a precharge signal;

charging the global column line from the proximal end in response to the precharge signal;

charging the global column line from the distal end in response to the precharge signal;

removing the precharge signal;

sensing a charged condition of the distal end of the global column line after removing the precharge signal;

grounding a first plate of an antifuse capacitor in response to the charged condition;

providing a voltage pulse to a second plate of the antifuse capacitor to rupture a dielectric separating the first and second plates;

sensing a programmed condition of the antifuse capacitor; and grounding the distal end of the global column line in response to the programmed condition.

32. A memory array arranged in rows and columns, the memory array comprising:

a global column line having proximal and distal ends and adapted to enable a predetermined number of columns in the memory array;

a repair circuit connected to the distal end of the global column line adapted to detect a fault on the global column line and disable the global column line if the fault is detected; and a driver circuit connected to the proximal end of the global column line, wherein the driver circuit is adapted to receive a precharge control signal and drive the global column line high from the proximal end in response to a precharge input signal and the repair circuit is adapted to receive the precharge control signal and drive the global column line high from the distal end in response to the precharge input signal, and wherein the distal end of the global column line remains high after the precharge control signal has been removed if the global column line is faulted.

33. The memory array of claim 32, further comprising:

a delay element connected between the precharge control signal and the driver circuit to provide a delayed precharge signal to the driver circuit.

34. The memory array of claim 32, the repair circuit including an antifuse capacitor, wherein the repair circuit is adapted to ground a negative plate of the antifuse capacitor if the distal end of the global column line remains high after the precharge control signal has been removed.

35. The memory array of claim 34, including a first transistor connected between the negative plate of the antifuse capacitor and a second transistor connected to ground, with the gate input of the second transistor being connected to the distal end of the global column line, and the gate input of the first transistor being connected to a program control signal.

36. The memory array of claim 34, wherein the antifuse capacitor is capable of being programmed by a voltage pulse applied to a positive plate of the antifuse capacitor if the negative plate is grounded.

37. The memory array of claim 32, wherein the repair circuit includes:

a transistor connected between a voltage source and the distal end of the global column line and having a gate input connected to the precharge control signal.

38. The memory array of claim 36, wherein the repair circuit includes a sensing circuit adapted to detect if the antifuse capacitor has been programmed.

39. The memory array of claim 38, wherein the repair circuit includes a first transistor connected between the antifuse capacitor and the sensing circuit, the gate input of the first transistor being connected to a program control signal.

40. The memory array as in claim 38, the sensing circuit providing an output at a first voltage level if the antifuse capacitor is intact and an output at a second voltage level if the antifuse capacitor has been programmed, wherein the repair circuit includes:

a transistor connected between the distal end of the global column line and ground and having a gate input connected to the sensing circuit.

41. The memory array of claim 39, wherein the sensing circuit includes:

a second transistor connected to a voltage source; and a node connected to the first transistor and the second transistor, wherein the gate input of the second transistor is connected to a read fuse control signal adapted to charge the node in response to the read fuse control signal and the antifuse capacitor provides a path to ground if programmed to discharge the node when the read fuse control signal is removed.

42. The memory array of claim 41, wherein the repair circuit includes:

a third transistor connected between the distal end of the global column line and ground and having a gate input connected to the node.

43. The memory array of claim 42, wherein the sensing circuit includes:

a NOR gate connected between the node and the third transistor; and a fourth transistor connected between a voltage source and the node and having a gate input connected to the output of the NOR gate, the fourth transistor and NOR gate cooperating to form a latch adapted to compensate for leakage current from the node if the antifuse capacitor remains intact.

44. A memory array arranged in rows and columns, the memory array comprising:

a global column line having proximal and distal ends and adapted to enable a predetermined number of columns in the memory array;

a driver circuit connected to the proximal end of the global column line; and a repair circuit connected to the distal end of the global column line, the repair circuit including:

a programming circuit including a programmable element, the programming circuit being adapted to detect a fault on the global column line and program the programmable element if the fault is detected; and a sensing circuit adapted to detect a programmed condition of the programmable element and ground the distal end of the global column line in response to the programmed condition, wherein the programmable element includes an antifuse capacitor having a positive plate and a negative plate, and wherein the programming circuit includes:

a first transistor connected between a voltage source and the distal end of the global column line having a gate input connected to a precharge control signal adapted to charge the global column line from the distal end in response to the precharge control signal;

a second transistor connected at its source to the negative plate of the antifuse capacitor and having a gate input connected to a programming control signal; and a third transistor connected between the drain of the second transistor and ground having a gate input connected to the distal end of the global column line.

45. A memory array arranged in rows and columns, the memory array comprising:

a global column line having proximal and distal ends and adapted to enable a predetermined number of columns in the memory array;

a driver circuit connected to the proximal end of the global column line; and a repair circuit connected to the distal end of the global column line, the repair circuit including:

a programming circuit including a programmable element, the programming circuit being adapted to detect a fault on the global column line and program the programmable element if the fault is detected; and a sensing circuit adapted to detect a programmed condition of the programmable element and ground the distal end of the global column line in response to the programmed condition, wherein the sensing circuit includes:

a first transistor connected between the distal end of the global column line and ground;

a logic gate having an output connected to a gate input of the first transistor;

a node connected to an input of the logic gate;

a second transistor connected to a voltage source and the node and having a gate input connected to a read fuse control signal adapted to charge the node in response to the read fuse control signal, wherein the programmable element provides a path to ground if programmed to discharge the node when the read fuse control signal is removed; and a third transistor connected between the voltage source and the node and having a gate input connected to the output of the logic gate, the third transistor and the logic gate cooperating to form a latch adapted to compensate for leakage current from the rode if the programmable element remains intact.

46. A method for repairing a memory array having a global column line, the method comprising:

detecting a fault on the global column line of the array; and disabling the global column line if the fault is detected, wherein the detecting includes:

providing a precharge signal;

charging the global column line from a proximal end in response to the precharge signal;

charging the global column line from a distal end in response to the precharge signal;

removing the precharge signal; and sensing a charged condition of the distal end of the global column line after removing the precharge signal.

47. A method for repairing a memory array having a global column line, the method comprising:

detecting a fault on the global column line of the array; and disabling the global column line if the fault is detected,
wherein the disabling includes:
   programming a programmable element, the programmable element including an antifuse capacitor,
and wherein programming includes:
   grounding a first plate of the antifuse capacitor in response to the charged condition; and
   providing a voltage pulse to a second plate of the antifuse capacitor to rupture a dielectric separating the first and second plates.

48. A method for repairing a memory array having a global column line, the method comprising:
   detecting a fault on the global column line of the array; and
   disabling the global column line if the fault is detected, wherein the disabling includes:
      programming a programmable element;
      sensing a programmed condition of the programmable element; and
      grounding a distal end of the global column line in response to the programmed condition, and
   wherein the sensing includes:
      providing a read fuse control signal;
      charging a node connected to the programmable element with a voltage in response to the read fuse control signal;
      removing the read fuse control signal; and
      monitoring the charged node to identify if the voltage is dissipated through the programmable element.

* * * * *